March 22, 1960 A. P. STERN 2,929,887

NEUTRALIZED SEMICONDUCTOR AMPLIFIER

Original Filed Nov. 22, 1955 2 Sheets-Sheet 1

INVENTOR:
ARTHUR P. STERN,
BY George V Eltgroth
HIS ATTORNEY.

NEUTRALIZED SEMICONDUCTOR AMPLIFIER

Original Filed Nov. 22, 1955

INVENTOR:
ARTHUR P. STERN,
BY George V. Eltgroth
HIS ATTORNEY.

United States Patent Office 2,929,887

Patented Mar. 22, 1960

2,929,887

NEUTRALIZED SEMICONDUCTOR AMPLIFIER

Arthur P. Stern, Syracuse, N.Y., assignor to General Electric Company, a corporation of New York Original application November 22, 1955, Serial No. 548,425. Divided and this application July 22, 1958, Serial No. 750,553

3 Claims. (Cl. 330—27)

Figure 1:
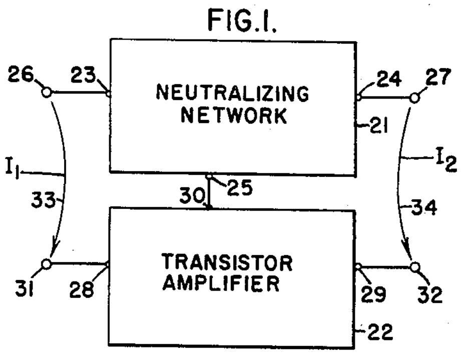

The present invention relates to semiconductor amplifiers and more particularly to semiconductor amplifiers wherein neutralization is achieved.

This application is a division of my copending application Serial No. 548,425 filed November 22, 1955, and assigned to the same assignee as the present application.

Semiconductor devices in all frequencies of operation are generally not perfectly unilateral; that is to say they exhibit not only forward transmission from the input to the output terminals but also backward transmission from the output to the input terminals. The backward transmission while of lesser magnitude than the forward transmission is usually still appreciable. An undesirable effect of the backward transmission, or internal feedback, is that the impedances presented at the input terminals are made dependent on the load impedances and the output impedances are made dependent on the source impedances. Internal feedback may further cause a tendency toward instability when the feedback is positive or reduce the available gain when the feedback is negative. To avoid these effects, it is often desirable to reduce the backward transmission in transistor amplifiers to a minimum.

The present invention is directed toward providing neutralization of a semiconductor device by the use of a small number of neutralizing impedances properly connected with the semiconductor device. By the use of these simple components, neutralization may be achieved either over wide or narrow ranges of frequencies.

The present invention is dissimilar in configuration from prior neutralizing circuits and, in addition, is based upon a different and broader principle. Previously, neutralization has been treated by analogy to a bridge in which the input terminals are placed at terminals reciprocally related to the output terminals. In accordance with the present invention, a more general treatment is made, based upon a generalized matrix involving the terminal voltages and impedances respectively of a semiconductor device and a separate neutralizing network.

Accordingly, it is an object of the present invention to provide an improved semiconductor amplifier system wherein neutralization is achieved.

It is another object of the present invention to provide an improved neutralization circuit for semi-conductor amplifiers utilizing a minimum number of circuit components.

These and other objects are achieved in a novel semiconductor amplifier employing a semiconductor device of the type having at least three electrodes in combination with a novel neutralization network. The semiconductor device and neutralizing network are so connected that the input current to the amplifier flows in series through a portion of the neutralizing network and the input terminals of the semiconductor device. Likewise the output current of the amplifier circulates through a portion of the neutralizing network and the output of the semiconductor device. By proportioning the backward transfer impedance of the neutralizing network to be of opposite phase and equal magnitude to the corresponding impedance of the transistor, neutralization is achieved.

Phase inverting means are provided in certain embodiments for inverting the polarity of current flow between the neutralizing network and the semiconductor device with respect to one of the input and output currents. This further simplifies the design of the neutralizing network when wide band neutralization is desired.

In one embodiment of the invention, a neutralizing arrangement for a grounded emitter semiconductor amplifier is disclosed in which the neutralizing network comprises an inductance and resistance connected in series between one input terminal of the amplifier and the base terminal of the semiconductor device. A transformer is also provided having its input terminals connected in shunt with the inductance and resistance. The transformer secondary terminals are connected in series between the collector electrode of the semiconductor device and one output terminal, and the secondary terminals are phased so that phase inversion is achieved with respect to the voltages applied at the input of the semiconductor device. In accordance with another aspect of the present invention, considerations are taught for the proportioning of the components of the neutralizing network.

In another embodiment of the present invention, wherein the semiconductor device operates in the grounded base configuration, a different neutralizing network is proposed comprising a resistance and capacitance in parallel employed with a phase inverting transformer. The method of proportioning these components is further disclosed.

In accordance with other aspects of the present invention both simpler and further refined network configurations are suggested; some for use with a phase inverting transformer and others for use without.

Figure 2A:
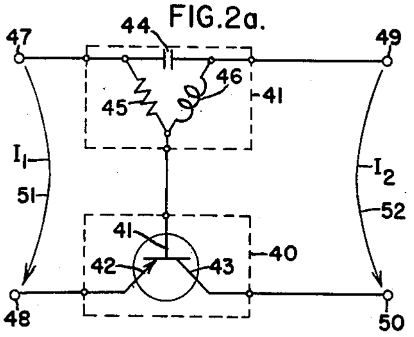
Figure 2B:
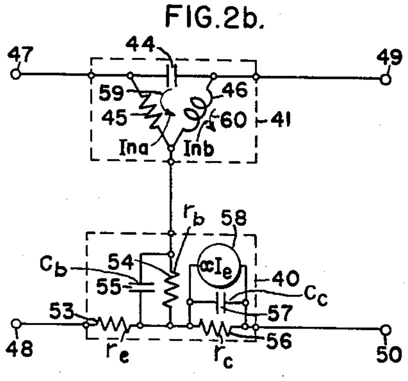
Figure 3A:
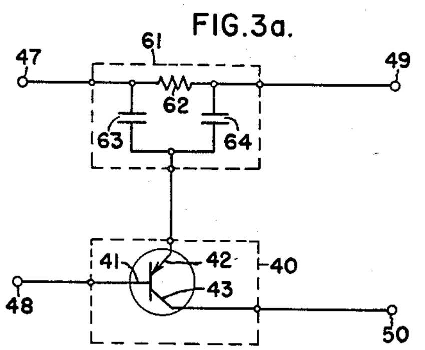
Figure 3B:
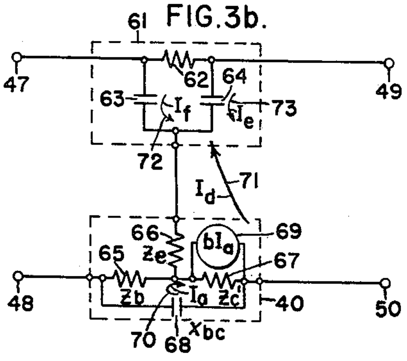
Figure 4A:
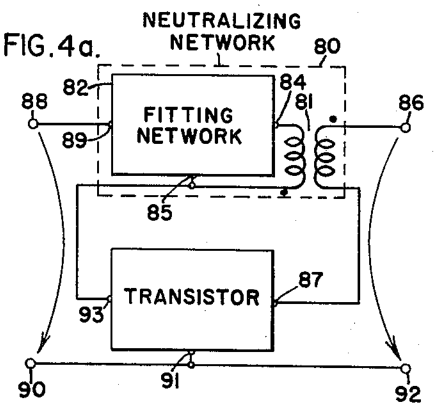
Figure 5A:
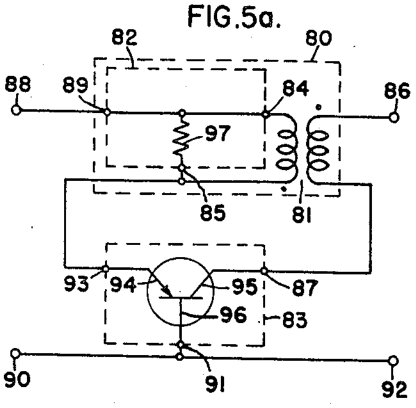
Figure 5B:
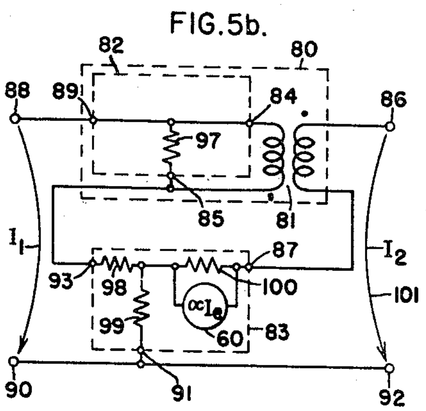
Figure 6:
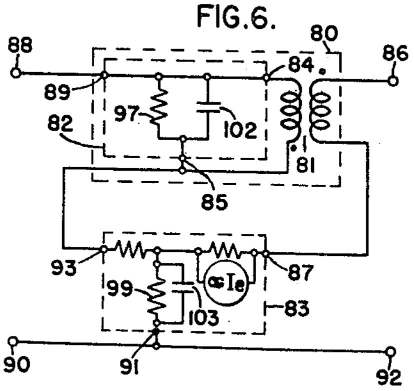
Figure 7:
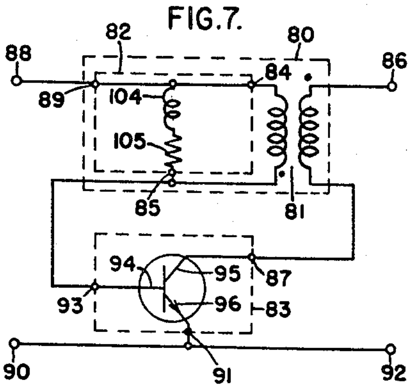

The features of the invention which are believed to be novel are set forth with particularity in the appended claims. The invention itself, however, both as to its organization and method of operation, together with further objects and advantages thereof may best be understood by reference to the following description when taken in connection with the following drawings, wherein:

Figure 1 is a block diagram illustrating the invention in its simplest and most general form;

Figures 2*a* and 2*b* illustrate a first embodiment of the invention wherein a transistor connected in common base configuration is neutralized over a narrow band. Figure 2*a* illustrates this embodiment in conventional symbols whereas Figure 2*b* presents a convenient equivalent circuit representation of the transistor;

Figures 3*a* and 3*b* illustrate a second embodiment of the invention wherein neutralization over a narrow band is effected. Figure 3*a* employs conventional symbols for the transistor whereas Figure 3*b* employs an equivalent circuit representation;

Figures 4*a*, 4*b*, 4*c*, and 4*d* represent in block diagram four generalized arrangements in which neutralization over a broad band is achieved. The arrangements each employ a phase inverting transformer in combination with an appropriate fitting network. They differ from one another in the placement of the phase inverting transformer: Figure 4*a* employing the transformer at the output terminals of the fitting network, Figure 4*b* employing the transformer at the output terminals of the transistor, Figure 4*c* employing the transformer at the input terminals of the fitting network, and Figure 4*d* employing the transformer at the input terminals of the transistor;

Figures 5*a* and 5*b* illustrate another specific embodiment of the invention for achieving neutralization over a relatively broad band at low frequencies. Figures 5*a* is a conventional circuit diagram whereas Figure 5*b* employs an equivalent circuit representation of the transistor;

Figure 6 is a circuit diagram of a further embodiment of the invention wherein neutralization over a broad band is achieved at moderate frequencies of operation. The transistor employed is shown in equivalent circuit diagram and is connected in the common base configuration; and Figure 7 illustrates a further embodiment of the invention wherein a transistor connected in common emitter configuration is neutralized over a relatively broad band.

The circuit shown in Figure 1 may now be referred to in explanation of the method of achieving neutralization of a transistor amplifier in accordance with the invention, as this figure illustrates the invention in its simplest and most general form. The neutralized amplifier comprises a three-terminal neutralizing network 21 and the transistor 22. The neutralizing network 21 is provided with an input terminal 23, an output terminal 24 and a common terminal 25. The neutralizing network input terminal 23 is connected to one input terminal 26 of the composite amplifier network, while the neutralizing network output terminal 24 is connected to the output terminal 27 of the composite amplifier network. The transistor 22 is provided with an input terminal 28, an output terminal 29 and a common terminal 30. The transistor input terminal 28 is connected to the other composite amplifier network input terminal 31, while the transistor output terminal 29 is connected to the other composite amplifier network output terminal 32. The common terminal 25 of the neutralizing network and the common terminal 30 of the transistor are connected together.

A simple qualitative explanation of the operation of the composite amplifier is that the neutralizing network 21 transfers energy from the output circuit back to the input circuit with a magnitude and phase such as to cancel the effect of reverse transfer through the transistor itself.

The operation of the composite amplifier network may be best explained by a resort to mathematical techniques. The conditions providing neutralization may be expressed by setting up the equations relating the signal voltages which would arise in the compensated amplifier to the impedances and signal currents of the amplifier. The equations for the signal surrents and voltages in the transistor follow:

$$E_{t1}=Z_{t11}I_{t1}+Z_{t12}I_{t2} \quad (1)$$
$$E_{t2}=Z_{t21}I_{t1}+Z_{t22}I_{t2} \quad (2)$$

where:

$E_{t1}$ is the voltage measured at the transistor input terminals (28, 30), $E_{t2}$ is the voltage measured at the output terminals of the transistor (29, 30), $I_{t1}$ is the current flowing between the transistor input terminals, $I_{t2}$ is the current flowing between the transistor output terminals, $Z_{t11}$ is the transistor open circuit input impedance. It is the impedance which the transistor presents to a source connected to the transistor input terminals, when the transistor output terminals are open circuited, $Z_{t22}$ is the transistor open circuit output impedance. It is the impedance which the transistor presents to a source connected to the transistor output terminals, when the transistor input terminals are open circuited, $Z_{t12}$ is the backward open circuit transfer impedance of the transistor. It is the impedance obtained by open circuiting the input terminals of the transistor and measuring the ratio between the voltage produced at the input terminals and a current forced between the transistor output terminals by a source connected to the transistor output terminals, and $Z_{t21}$ is the forward open circuit transfer impedance of the transistor. It is measured by open circuiting the output terminals, and observing the ratio between the voltage produced at the output terminals of the transistor and the current flowing through the input terminals of the transistor under the influence of a source connected to the transistor input terminals.

The separate voltages for the neutralizing network may be written as follows:

$$E_{n1}=Z_{n11}I_{n1}+Z_{n12}I_{n2} \quad (3)$$
$$E_{n2}=Z_{n21}I_{n1}+Z_{n22}I_{n2} \quad (4)$$

These variables are defined in a similar manner to those defined with respect to the transistor, i.e.:

$E_{n1}$ is the neutralizing network input voltage, $E_{n2}$ is the neutralizing network output voltage, $I_{n1}$ is the neutralizing network input current, $I_{n2}$ is the neutralizing network output current, $Z_{n11}$ is the neutralizing network open circuit input impedance, $Z_{n22}$ is the neutralizing network open circuit output impedance, $Z_{n12}$ is the neutralizing network backward open circuit transfer impedance, and $Z_{n21}$ is the forward open circuit transfer impedance of the neutralizing network.

If we serially connect the input terminals of the neutralizing network with the transistor and the output terminals of the neutralizing network with the output terminals of the transistor, a number of new current and voltage relations arise. The input current of the transistor ($I_{t1}$) becomes identical to the input current ($I_{n1}$) of the neutralizing network. Likewise the output current $I_{t2}$ of the transistor becomes identical to the output current $I_{n2}$ of the neutralizing network. In view of these identities, we may designate the input current of the amplifier as $I_1$, and the output current of the amplifier as $I_2$. The current $I_1$ is indicated by the arrow 33. It flows along a path which includes the terminals 26, 23, 25, 30, 28, and 31 in sequence. The output current $I_2$ is represented by the arrow 34. It follows a path which includes in sequence terminals 27, 24, 25, 30, 29, and 32.

The input voltage ($E_1$) of the amplifier may now be defined as the sum of the input voltage ($E_{t1}$) of the transistor and the input voltage ($E_{n1}$) of the neutralizing network and the output voltage ($E_2$) of the amplifier may be defined as the sum of the transistor output voltage ($E_{t2}$) and the neutralizing network output voltage ($E_{n2}$).

Equations 1, 2, 3, and 4 may now be reexpressed in terms of the amplifier currents and voltage:

$$E_1=(Z_{n11}+Z_{t11})I_1+(Z_{n12}+Z_{t12})I_2 \quad (5)$$
$$E_2=(Z_{n21}+Z_{t21})I_1+(Z_{n22}+Z_{t22})I_2 \quad (6)$$

For neutralization, $E_1$ should be independent of $I_2$. This is true when the factor:

$$Z_{n12}+Z_{t12}=O;\ Z_{n12}=-Z_{t12} \quad (7)$$

Expression 7 indicates the conditions which exist when the amplifier is completely neutralized. Expressions 5 and 6 are established by proper connection of the neutralizing network to the transistor in the manner indicated. Expression 7, however, can only be satisfied by proper adjustment of the parameters of the transistor and neutralizing network. The transistor backward open circuit transfer impedance $Z_{t12}$ generally contains a positive resistive component. Accordingly, it is necessary that the neutralizing network exhibit a negative resistive component in its backward open circuit transfer impedance $Z_{n12}$ if a phase inverter is not employed. A negative backward transfer impedance may be realized in practive by a number of simple circuits. For instance, a two section RC network can provide this effect. Figures 2*a* and 3*a* show compensated amplifiers in which such neutralizing networks are employed.

Figures 2*a* and 2*b* illustrate a neutralized transistor amplifier connected in common base configuration in accordance with the invention. The transistor 40 and the neutralizing network 41 form the principal portions of the amplifier. The transistor 40 is provided with an emitter electrode 42, a base electrode 41' and a collector electrode 43. The neutralizing network 41 comprises a capacitor 44, a resistor 45 and an inductor 46 each connected in series in the order recited in a closed loop. The junction between the resistor 45 and the inductor 46 is connected to the base electrode 41'. The amplifier input terminals 47 and 48 are connected respectively to the common terminal of the capacitor 44 and the resistor 45 and to the emitter electrode 42. The amplifier output terminals 49 and 50 respectively are connected to the common terminal of the capacitor 44 and inductor 46 and the collector electrode 43. By inspection, it may now be seen that the embodiment shown in Figure 2*a* is a specific example of the generalized neutralized amplifier shown in Figure 1. The primary current of the amplifier shown by the arrow 51 passes sequentially through a portion of the neutralizing network and a portion of the transistor as does the secondary current $I_2$ represented by the arrow 52. Likewise, the total amplifier input voltage ($E_1$) is the sum of the voltage appearing across the input terminals of the neutralizing network and the voltage across the transistor input terminals. Similarly, the amplifier output voltage $E_2$ is the sum of the voltage appearing at the output terminals of the neutralizing network and the voltage at the output terminals of the transistor.

The method by which neutralization is effected by the illustrated configuration and the proportioning of the elements of the neutralizing network may be understood by reference to Figure 2*b*. Figure 2*b* is a drawing of the same embodiment shown in Figure 2*a* with the transistor 40 now being represented in equivalent diagram form. Reference numerals which first occurred in Figure 2*a* have been repeated wherever like elements have been shown in Figure 2*b*. The transistor 40 is shown in a "T-equivalent" circuit diagram appropriate for medium frequencies wherein the first branch is formed of a resistance 53, which is the resistance effectively appearing in the emitter lead and conveniently designated the emitter resistance ($r_e$), a second branch comprising a resistance 54 shunted by a capacitance 55, and a third branch comprising a resistance 56, a capacitance 57 and an equivalent current generator 58 all in shunt. The resistance 54 and the capacitance 55 appear in the base lead and are designated respectively the base resistance ($r_b$) and the base capacitance ($c_b$). The resistance 56, and the capacitance 57 appear in the collector lead and are designated the collector resistance ($r_c$), and the collector capacitance ($c_c$).

The backward open circuit transfer impedance ($Z_{t12}$) of the transistor is obtained in the following manner. This impedance may be measured by forcing a secondary current ($I_2$) through the output terminals and measuring the voltage developed between the input terminals of the transistor when no external input connections are made to the transistor:

$$\frac{E_{t1}}{I_2}=Z_{t12} \tag{8}$$

By reference to the drawing, it may be seen that the magnitude of the voltage developed at the input terminals is merely the product of the secondary current ($I_2$) and the impedance ($Z_b$) of the base branch of the "T-equivalent" circuit:

$$E_{t1}=I_2Z_b;\ \frac{E_{t1}}{I_2}=Z_b \tag{9}$$

where $Z_b$ designates the impedance of the base branch of the "T-equivalent" circuit. Accordingly, $$Z_b=Z_{t12} \tag{10}$$

The backward open circuit transfer impedance is equal to the impedance of the base branch of the T-equivalent circuit. The backward open circuit transfer impedance $Z_{t12}$ which comprises a resistance and capacitance in shunt may now be written in conventional complex notation:

$$Z_{t12}=\frac{1}{jwc_b+\frac{1}{r_b}}=\frac{r_b}{1+jwc_br_b} \tag{11}$$

Separating real and imaginary components, this expression becomes:

$$Z_{t12}=\frac{r_b}{1+w^2c_b^2r_b^2}-j\frac{wc_br_b^2}{1+w^2c_b^2r_b^2} \tag{12}$$

Neutralization is provided by the network 41 comprising a resistor, capacitor and inductor. When Expression 7 is satisfied, this network is proportioned to exhibit a complex backward open circuit transfer impedance having a negative resistive component and an inductive reactive component of appropriate magnitude. That the network has these properties, may be demonstrated by resort to the following network equations:

$$E_{n2}=I_{nb}jwL-I_{na}jwL \tag{13}$$

$$O=-I_{nb}jwL+I_{na}\left(jwL+\frac{1}{jwC}+R\right) \tag{14}$$

where, $I_{na}$ is the current circulating in the counter clockwise direction in the neutralizing network. It is represented by the arrow 59.

$I_{nb}$ is the current flowing between the output terminals of the neutralizing network indicated by the arrow 60;

L is the inductance of the inductor 46;

C is the capacitance of the capacitor 44; and

R is the resistance of the resistor 45.

Solving Expression 14 for $I_{na}$:

$$I_{na}=I_{nb}\frac{jwL}{jwL+\frac{1}{jwC}+R} \tag{15}$$

The voltage $E_{n1}$ with open circuited primary terminals becomes:

$$E_{n1}=I_{na}R=I_{nb}\frac{jwLR}{jwL+\frac{1}{jwC}+R} \tag{16}$$

The backward transfer impedance ($Z_{n12}$) of the neutralizing network is defined as the ratio of $En_1$ to the external current forced through the output terminals. This current is $I_{nb}$ illustrated by the arrow 60 in Figure 2*a*. Hence:

$$Z_{n12}=\frac{E_{n1}}{I_{nb}}=\frac{jwLR}{jwL+\frac{1}{jwC}+R} \tag{17}$$

Separating in Expression 17 the resistive and reactive components:

$$Z_{n12}=-\frac{wLR\left(\frac{1}{wC}-wL\right)}{R^2+\left(\frac{1}{wC}-wL\right)^2}+j\frac{wLR^2}{R^2+\left(\frac{1}{wC}-wL\right)^2} \tag{18}$$

Expression 18, it may be seen, includes a negative resistive component so long as:

$$\frac{1}{wC}-wL>0 \tag{19}$$

The reactive component is always of the inductive variety. Accordingly, it may be seen that by suitable selection of R, L and C, the backward transfer impedance $Z_{n12}$ of the neutralizing network may be adjusted to be equal to and of opposite phase to the backward transfer characteristic ($Z_{t12}$) of the transistor. Satisfaction of this condition brings about neutralization of the transistor.

The above embodiment illustrates the application of the invention to neutralize a transistor connected in the common base configuration. While the mathematical description of neutralization of the common emitter configuration is somewhat more complicated, the invention is equally applicable thereto. Figures 3*a* and 3*b* illustrate a circuit configuration wherein neutralization of a transistor connected in common emitter configuration is achieved. Referring now to Figure 3*a* we have a transistor 40 and a neutralizing network 61. The neutralizing network comprises a resistance 62, a capacitance 63 and a capacitance 64 connected in the order recited into a closed loop. The junction of capacitance 63 to capacitance 64 is connected to the emitter electrode 42 of the transistor. The amplifier input terminal 47 is connected to the common terminal of the resistor 62 and capacitor 63. The other amplifier input terminal 48 is connected to the base electrode 41'. The amplifier output terminal 49 is connected to the junction between the resistor 62 and the capacitor 64. The remaining amplifier output terminal 50 is connected to the transistor collector electrode 43.

Figure 3*b* is an equivalent circuit diagram of the embodiment shown in Figure 3*a*. The transistor accordingly is shown in a modified T-equivalent circuit in order to approximate the characteristics which the transistor exhibits at moderate frequencies in the common emitter configuration. The equivalent circuit comprises three impedances appearing respectively in the base, emitter and collector leads designated respectively the base impedance ($Z_b$) bearing a reference numeral 65, the emitter impedance ($Z_e$) bearing a reference numeral 66 and the "common emitter collector impedance" ($Z_c'$) bearing the reference numeral 67. In order to more accurately describe the operation of the transistor, this equivalent circuit is further modified by the addition of a capacitive reactance ($X_{bc}$) bearing a reference numeral 68 which effectively appears between the base and collector terminals. The equivalent current generator is shown at 69 generating current at a rate equal to the product of the current amplification factor (*b*) in common emitter configuration and the base current $I_b$.

The common emitter configuration exhibits a positive resistive and an inductive reactive impedance, in its backward transfer characteristic ($Z_{t12}$). Resort may now be had to the circuit equations describing the transistor equivalent circuit of Figure 3*b*. Equating the voltage in the loop including impedances 65, 67, and 68 and the current generator 69, we find:

$$I_aZ_b+I_aX_{bc}+I_aZ_c'+bI_aZ_c'-I_dZ_c'=0 \qquad (20)$$

$$E_1=I_aZ_b+I_dZ_e \qquad (21)$$

where $I_a$ designated by the arrow 70 in Figure 3*b* is the current in the loop which includes impedances 65, 67 and 68, $I_d$ is a current represented by the arrow 71 flowing through the transistor output terminals under the influence of a generator connected to the output terminals, when the input terminals are open circuited, and $bI_a$ represents the current flowing through the equivalent generator 69 since the base current is now equal to $I_a$.

Solving Expression 20 for $I_a$ in terms of $I_d$, $$I_a=I_d\frac{Z_c'}{Z_b+X_{bc}+(1+b)Z_c'} \qquad (22)$$

Since the common emitter current amplification *b* is equal to $$\frac{a}{1-a}$$

where *a* is the common base current amplification and since the common emitter collector impedance "$Z_c'$" is equal to $Z_c(1-a)$, where $Z_c$ is the common base collector impedance, Expression 22 can also be written:

$$I_a=I_d\frac{Z_c(1-a)}{Z_b+X_{bc}+Z_c} \qquad (23)$$

The value for $I_a$ obtained in Expression 23 is then substituted into Expression 21:

$$E_1=I_d\frac{Z_bZ_c(1-a)}{Z_b+X_{bc}+Z_c}+I_dZ_e \qquad (24)$$

By definition, the backward transfer impedance of the transistor ($Z_{t12}$) is equal to ratio of the voltage developed at the input terminals when open circuited to the current forced between the output terminals:

$$Z_{t12}=\frac{E_1}{I_d}=Z_e+\frac{Z_bZ_c(1-a)}{Z_b+X_{bc}+Z_c} \qquad (25)$$

This expression may be further simplified by noting that already at relatively low frequencies $Z_c$ is principally capacitive. In conventional transistors, $Z_c$ may be composed of a resistance of several megohms in shunt with a capacitance on the order of 10 micromicrofarads. Let us represent $Z_c$, acordingly, as $1/jwC$. Likewise $X_{bc}$, the reactance of the capacitance between the base and collector may be represented by $1/jwC_{bc}$. Since $Z_b$ the base impedance is small with respect to the other impedances in the denominator of the fraction of Expression 25, it may be neglected. Making these approximations in Expression 25, the following expression is obtained:

$$Z_{t12}\sim Z_e+Z_b(1-a)\frac{C_{bc}}{C+C_{bc}} \qquad (26)$$

It will be noted that the complex numbers accompanying the capacitive reactances have now been cancelled. This does not make the left hand member of Expression 26 purely resistive however. This is because *a* is in fact a complex number. It is customarily represented by the following notation:

$$a=\frac{a_0}{1+j\frac{w}{w_0}} \qquad (27)$$

where:

$a_0$ is the common base current amplification of the transistor at low frequencies,

*w* is the frequency of which *a* is being measured in radians per second, and $w_0$ is the transistor cut-off frequency in radians per second. $(1-a)$ may be reexpressed:

$$(1-a)=1-\frac{a_0}{1+\frac{jw}{w_0}}=\frac{1-a_0+\frac{jw}{w_0}}{1+j\frac{w}{w_0}} \qquad (28)$$

This expression may be further simplified if the frequency considered is considerably larger than $(1-a_0)w_0$ but considerably smaller than $w_0$. Then $(1-a_0)$ is negligible with respect to $$\frac{jw}{w_0},\text{ and } j\frac{w}{w_0}$$

is negligible with respect to 1 so that:

$$(1-a)=j\frac{w}{w_0} \qquad (29)$$

Substituting the value for $(1-a)$ into Expression 26, $$Z_{t12}=Z_e+jZ_b\frac{w}{w_0}\frac{C_{bc}}{C+C_{bc}} \qquad (30)$$

At moderate frequencies $Z_e$ is principally resistive and contributes a capacitive component which is much less than the inductive contribution made by the second term of Expression 30. $Z_b$ on the other hand is primarily a pure resistance. Accordingly, Expression 30 indicates that the backward transfer impedance of a transistor in common emitter configuration is essentially a resistance and an inductive reactance (at medium frequencies of operation) and also indicates the approximate magnitudes of these quantities.

The network illustrated in Figures 3*a* and 3*b* exhibits a backward transfer impedance ($Z_{n12}$) which has a negative resistive and a capacitive reactive component. Accordingly, by proper choice of its parameters, it can be used to neutralize a transistor connected in common emitter configuration.

The equations describing the network with input terminals open circuited follow:

$$-I_e\frac{1}{jwC_{64}}+I_f\left(\frac{1}{jwC_{64}}+\frac{1}{jwC_{63}}+R_{62}\right)=0 \qquad (31)$$

where:

$I_e$ is the current flowing between the output terminals of the network 61 under the influence of a generator connected to the output terminals. The current $I_e$ is designated by the arrow 73.

$I_f$ is the current flowing through the loop comprising capacitor 63, resistor 62 and capacitor 64, which current is represented by the arrow 72.

$R_{62}$, $C_{63}$ and $C_{64}$ are the corresponding resistances and capacitances of the elements of network 61 bearing the indicated reference numerals. Solving Expression 31 for $I_f$ in terms of $I_e$:

$$I_f=I_e\frac{\frac{1}{jwC_{64}}}{\frac{1}{jwC_{64}}+\frac{1}{jwC_{63}}+R_{62}} \qquad (32)$$

When the input terminals are open circuited, the current $I_e$ forced between the output terminals establishes the voltage $E_{n1}$ between the input terminals of the neutralizing network, which voltage may be expressed as follows:

$$E_{n1}=I_f\frac{1}{jwC_{63}}=I_e\frac{\frac{1}{jwC_{63}C_{64}}}{\frac{1}{C_{64}}+\frac{1}{C_{63}}+jwR_{62}} \qquad (33)$$

The backward transfer impedance ($Z_{n12}$) is defined as the ratio of $E_{n1}$ to $I_e$ and may now be expressed in terms of the neutralizing circuit parameters:

$$Z_{n12}=\frac{E_{n1}}{I_e}=\frac{\frac{1}{C_{63}C_{64}}}{\left(\frac{1}{C_{64}}+\frac{1}{C_{63}}\right)jw-w^2R_{62}} \qquad (34)$$

upon separating the real and imaginary components of expression 34 we obtain:

$$Z_{n12}=\frac{-w^2R_{62}-jw\left(\frac{1}{C_{64}}+\frac{1}{C_{63}}\right)}{C_{63}C_{64}\left(w^4R_{62}^2+w^2\left(\frac{1}{C_{64}}+\frac{1}{C_{63}}\right)^2\right)} \qquad (35)$$

Examination of Expression 35 shows that it is composed of a negative resistive and a capacitive reactive component. By appropriate proportioning of the network elements to satisfy Expression 7, complete neutralization may be achieved.

The embodiments of Figures 2 and 3 give precise neutralization when the vector which represents the transistor backward open circuit transfer impedance is in precise opposition to the vector which represents the neutralizing network backward open circuit transfer impedance. The neutralization in these first two embodiments extends over a narrow frequency range. This is true because the backward open circuit transfer impedances of the compensating network and the transistor usually have dissimilar frequency responses, i.e. amplitude and phase response in the presence of changing frequency. Hence, although the characteristics of the two match at one frequency, an increase or decrease from that frequency brings about unequal changes in phase and magnitude between the transistor and the neutralizing network impedances and a resultant impairment of neutralization.

Neutralization over a wider range can be achieved, however, by use of a neutralizing network including a matching circuit whose backward open circuit transfer impedance approximates in its phase and magnitude versus frequency characteristics the corresponding transfer impedance of the transistor in combination with a phase inverting element such as a transformer. The transformer obviates the need for the matching circuit to provide both the initial 180° phase shift at the center neutralization frequency between the backward transfer impedances of the neutralizing network and transistor while maintaining phase angle and magnitude correspondence between these impedances as one varies the frequency above and below the center frequency. Arrangements employing a transformer are shown in Figures 4, 5, 6 and 7. When a fitting network which has similar properties to a transistor is so employed, the rate of change of the backward transfer impedance of the fitting network can be made to change at approximately the same rate as the backward transfer impedance of the transistor. If a fitting network is chosen which is precisely equivalent to that of the transistor, and a perfect transformer is employed, then theoretically perfect neutralization could be achieved throughout a wide range of frequencies. The practical limits are set by the accuracy of the phase inverting device i.e. the transformer, and by the precision with which the backward transfer impedance of the fitting network can be made to match the corresponding characteristic of the transistor by using a moderate number of circuit components.

The ways in which a transformer impedance inverter may be employed may be understood by further consideration of Expression 7 and by reference to the manner in which the characteristic backward transfer impedances of the transistor and the neutralizing network are defined. It should be noted that in both cases, a current measurement is taken at a different pair of terminals from the terminals at which the voltage measurement is taken. Accordingly, a reversal in sign of the measured impedance may be obtained by inserting a transformer having ideal characteristics i.e. a unity coupling, and 180° phase shift. Since the Relationship 7 specifies only that the sum of the backward transfer impedance of the transistor and of the neutralizing network be identical to zero, it does not specify whether the neutralizing network or the transistor exhibit the negative component or whether the reversal occurs in the input or output circuit. Accordingly, the required phase reversals may be obtained by connection of a phase inverting transformer to either the input or output terminals of the transistor or to either the input or output terminals of the neutralizing network. Figures 4*a*, 4*b*, 4*c* and 4*d* illustrate the diverse ways in which a transformer may be employed to achieve the requisite phase inversion in an amplifier which is neutralized over a broad band.

In Figure 4*a* the neutralizing network 80 indicated in broken lines comprises a phase inverting transformer 81 and a transistor characteristic fitting network 82. The transformer 81 is connected between the output terminals of the fitting network 82 so as to invert the phase of the fitting network. The transformer 81 has its primary winding connected between the output terminals 84 and 85 of the fitting network, and its secondary winding connected between the amplifier output terminal 86 and the transistor output terminal 87. The amplifier input terminal 88 is connected to the fitting network input terminal 89 while the other amplifier input terminal 90 is connected to the transistor common terminal 91 and to the other amplifier output terminal 92. The fitting network common terminal 85 is connected to the transistor input terminal 93.

Figure 4B:
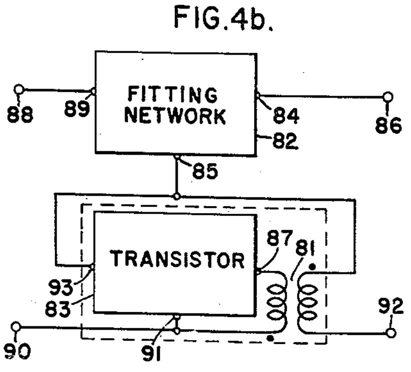

In Figure 4*b* the primary of the phase inverting transformer 81 is connected between the transistor output terminal 87 and its common terminal 91. The transformer secondary winding is connected between the common terminal 85 of the fitting network and an amplifier output terminal 92. The fitting network output terminal 84 is connected directly to the amplifier output terminal 86. The remaining connections are similar to those illustrated in Figure 4*a*: the amplifier input terminal 88 is connected to the fitting network input terminal 89; the amplifier input terminal 90 is connected to the transistor common terminal 91 and the transistor input terminal 93 is connected to the fitting network common terminal 85.

Figure 4C:
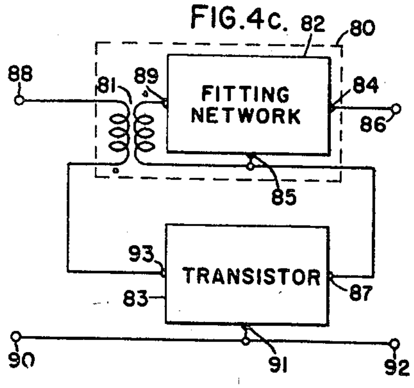
Figure 4D:
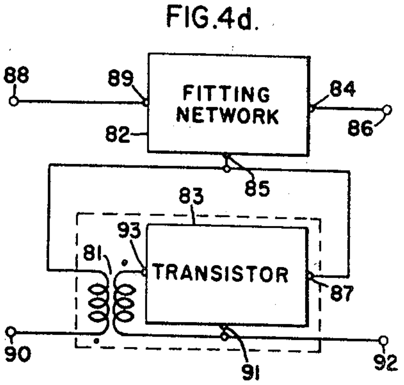

The phase inverting transformer may also be connected to the input side of the amplifier as illustrated in Figures 4*c* and 4*d*. In Figure 4*c* the primary winding of the phase inverting transformer 81 is connected between the amplifier input terminal 88 and the transistor input terminal 93. The transformer secondary winding is connected between the fitting network input terminal 89 and its common terminal 85. The common terminal 85 of the fitting network is also connected to the output terminal 87 of the transistor. The output amplifier terminal 86 is connected to the fitting network output terminal 84. The remaining amplifier input and output terminals 90 and 92 respectively, are connected to the transistor common terminal 91.

In Figure 4*d* the phase inverting transformer 81 is connected to the transistor input terminals. The primary winding of the transformer is connected between the amplifier input terminal 90 and the fitting network common terminal 85. The secondary winding of the transformer is connected between the transistor input terminal 93 and its common terminal 91. The transistor output terminal 87 is connected to the common terminal 85 of the fitting network. The amplifier terminal 92 is connected to the common terminal 91 of the transistor. The other amplifier terminals 88 and 86 are connected respectively to the fitting network input terminal 89 and output terminal 84.

In each of the generalized illustrative arrangements of Figures 4*a*, 4*b*, 4*c* and 4*d* a box type representation of the transistor has been employed without specification as to which electrodes of the transistor form the input, output or common terminals. Neutralization may be achieved by practice of the invention in any of the transistor configurations in which neutralization is desirable.

Figures 5*a* and 5*b* illustrate a specific embodiment of the invention wherein a transistor connected in a common base configuration is neutralized by a circuit employing a fitting network and a phase inverting transformer. Figure 5*a* is a circuit diagram of this embodiment while Figure 5*b* is a circuit diagram in which the transistor is shown in equivalent circuit diagram for purposes of explanation. The embodiment of Figures 5*a* and 5*b* is a specific case of the neutralized amplifier arrangement shown in Figure 4*a*, and wherever elements shown in Figure 4*a*, have been repeated in Figures 5*a* and 5*b*, the same reference numerals have been applied.

The neutralized transistor amplifier shown in Figures 5*a* and 5*b* comprises a transistor 83 having an emitter electrode 94, a collector electrode 95, and a base electrode 96; and a four terminal neutralizing network 80 comprising a fitting resistance 97 and a phase inverting transformer 81. One amplifier input terminal 88 is connected to an input terminal of the transformer 81. The other input terminal of the transformer 81 is connected to the emitter electrode 94. The transformer secondary winding is connected between an amplifier output terminal 86 and the transistor collector electrode 95. The fitting resistance 97 is connected across the primary terminals of the transformer 81. The remaining amplifier input and output terminals 90 and 92 are connected to the transistor base electrode 96.

Figure 5*b* may be referred to in explanation of the mode of achieving neutralization and of the manner in which the fitting resistance 97 is chosen. In this figure, the transistor is shown in its "T-equivalent" circuit diagram. The "T-equivalent" representation employed comprises a first resistance 98 effectively appearing in the emitter lead and designated the emitter resistance ($r_e$), a second resistance 99 appearing in the base lead and designated the base resistance ($r_b$), and a third impedance 100 appearing in the collector lead and designated the collector impedance ($Z_c$). This impedance is shunted by the equivalent generator 106. The values of these equivalent resistances may be readily measured for any particular transistor, and in conventional transistors, these values are usually well-known. The resistance which is of particular importance with respect to neutralization is the resistance 99 appearing in the base lead. This resistance varies from approximately 100 to 2,000 ohms in the most common transistors. In accordance with the invention, the fitting resistance 97 is chosen to be of the same value as the base resistance 99, when the transformer ratio is unity. The basis for this correspondence may be explained by a resort to Figure 5*b* and consideration of Relation 7 which defines the conditions for neutralization:

$$Z_{n12}=Z_{t12} \quad (36)$$

In defining $Z_{t12}$, the backward open circuit transfer impedance of the transistor, a given secondary current $I_2$ indicated by the arrow 101 is forced between the transistor output terminal 87 and its common terminal 91. In measuring the transistor input terminal voltage $E_{t1}$, a high impedance voltmeter is connected between the terminals 93 and 91 of the transistor. At the same time all other input connections to the transistor are opened. The voltage $E_{t1}$ is then the voltage drop in $r_b$ from the current $I_2$ flowing through it:

$$E_{t1}=I_2 r_b \quad (37)$$

but by definition, $$Z_{t12}=\frac{E_{t1}}{I_2} \quad (38)$$

Thus, we find that:

$$Z_{t12}=r_b \quad (39)$$

i.e. at the backward transfer impedance of the transistor is equal to the base resistance $r_b$.

Having obtained the transistor open circuit backward transfer impedance, the neutralizing network may be designed. Expression 39, indicates that a purely ohmic resistance is required, having assumed that the transistor may be treated as a purely ohmic device at the frequencies in question and that the transformer 81 has a 180° phase shift. Let us further assume a transformer turns ratio of N to 1, and a unity coupling coefficient. When these conditions are true the current flowing through the secondary windings ($I_2$) induces a current in the primary winding of $I_2/N$. Assuming an otherwise open circuited primary, the following voltage ($E_{n1}$) will be induced across the fitting resistance $r_f$ if one forces a current $I_2$ through the secondary:

$$E_{n1}=-\frac{I_2}{N}R_f;\ \frac{E_{n1}}{I_2}=-\frac{R_f}{N} \quad (40)$$

The backward transfer characteristic of the neutralizing network $Z_{n12}$ is defined as:

$$Z_{n12}=\frac{E_{n1}}{I_2} \quad (41)$$

Hence:

$$Z_{n12}=-\frac{R_f}{N} \quad (42)$$

I.e., the open circuit backward transfer impedance ($Z_{n12}$) is equal to $-R_f/N$. Accordingly, in order to achieve neutralization:

$$\frac{R_f}{N}=r_b \qquad (43)$$

The embodiment illustrated in Figures 5*a* and 5*b* provides excellent compensation when the equivalent capacitance (not shown in Figures 5*a* and 5*b*) across the base resistance 99 may be neglected. At moderate frequencies, this assumption can no longer be made. Accordingly, when operation over a higher range or wider range of frequencies is desired, the fitting network 82 should take this capacity into account. When this is done, the network may take the form of a resistance 97 and a capacitance 102 in shunt with the primary winding of the transformer 81 as shown in the embodiment of Figure 6. The elements forming the base impedance are the base resistance 99 and the base capacitance 103. When the transformer 81 has a turns ratio of unity and a unity coupling coefficient and 180° phase shift, the resistance 97 of the neutralizing network may be precisely equal to the resistance 99 of the transistor, and the capacitance 102 of the neutralizing network may be set equal to the base capacity 103 of the transistor.

A further embodiment of the invention is shown in Figure 7. Here, a transistor 83 connected in common emitter configuration is neutralized by use of a neutralizing network 80 employing a fitting network 82 and a phase inverting transformer 81. This arrangement is a special example of the generalized neutralizing arrangement illustrated in Figure 4*a*. Reference numerals which have been previously employed to designate like elements in previous figures have been retained in Figure 7. The fitting network 82 comprises an inductance 104 and a resistance 105 connected in series with one another and in shunt with the primary winding of the phase inverting transformer 81. The amplifier input terminal 88 is connected to the terminal of the inductance 104 connected to one transformer terminal. The other amplifier input terminal is connected to the transistor emitter 96 and to the amplifier output terminal 92. The amplifier output terminal 86 is connected to one terminal of the secondary winding of the transformer 81. The other end of the secondary winding of the transformer 81 is connected to the transistor collector electrode 95. The base electrode 94 of the transistor is connected to the terminal of the resistor 105 remote from the inductor 104.

Neutralization is achieved in this figure by proportioning the components of the neutralizing network 80 so that the backward transfer impedance of the neutralizing network is in precise opposition to the backward transfer impedance of the transistor 83. The earlier discussion of the transistor in common emitter configuration establishes that at medium frequencies, the backward transfer impedance of the transistor is formed of a resistive and an inductive component. Accordingly, in order to achieve neutralization, the neutralizing network must exhibit a negative resistive and a capacitive reactive backward transfer impedance. The prior discussion should now make it clear that the inductance and resistance connected in the manner illustrated in Figure 7 across the primary winding of the phase inverting transformer 81 does exhibit such a negative resistive and capacitive reactive backward transfer impedance. The approximate proportioning of these components may be determined by use of Expression 30. Exact values may be obtained by measuring the backward transfer impedance of the transistor directly. In a circuit arrangement employing a rate grown triode transistor of the type ZJ6, an inductance of 1.5 microhenries and a resistance of 25 ohms was found to produce neutralization over a range of frequencies centered at 500 kilocycles.

While in the discussion of the proportioning of the elements in the neutralizing network, resort has been made to well known equivalent circuit transistor representations, it should be understood that these representations have been used to give approximate mathematical values for the parameters which would be required in a neutralizing network. It should be kept in mind, however, that the critical parameters i.e., the backward transfer impedance of the transistor may be conveniently and directly measured in most cases by experimental means. In practice, it may often be more convenient to experimentally determine the backward transfer impedance of the transistor.

The term "medium" and "moderate" frequencies has been used to designate a range of frequencies defined by the transistor properties, i.e., a frequency which is less than the *a* cut off frequency in common base connection and larger than the *b* cut off frequency in common emitter connection.

The term "fitting network" has here been used to designate that portion of the neutralizing network whose backward transmission characteristics are made to approximate or "fit" the appropriate backward transmission characteristic of the transistor. It is specifically intended that the fitting network not include the phase inverting transformer.

In the design of the neutralizing network, it should also be understood that many variations in fitting networks may be employed which exhibit impedances lying in the proper quadrant, and having the desired magnitudes to achieve neutralization of the transistor. While particular embodiments of the invention have been shown and described, it should be understood that the invention is not limited thereto, and that it is intended in the appended claims to claim all such variations as fall in the true spirit of the present invention.

What I claim as new and desire to secure by Letters Patent of the United States is:

1. A transistor amplifier comprising a transistor having a first, a second and a third electrode and characterized by a known open circuit backward transfer impedance, a neutralizing network consisting of three branches connected in series in a closed loop and having three junctions, each branch comprising an impedance, said impedances being proportioned to exhibit an open circuit backward transfer impedance which is of essentially equal magnitude and essentially opposite phase to the backward transfer impedance of said transistor, means for coupling said first electrode to a first junction of said network, a pair of amplifier input terminals connected respectively to said second electrode and to a second junction of said network, and amplifier output terminals connected respectively to said third electrode and to a third junction of said network.

2. A transistor amplifier comprising a transistor having base, emitter and collector electrodes, a neutralizing network comprising a resistor, an inductor, and a capacitor connected in the order recited in series in a closed loop, the components of said neutralizing network being proportioned to exhibit an open circuit backward transfer impedance which is of essentially equal magnitude and essentially opposite phase to the backward transfer impedance of said transistor, means for coupling said base electrode to the junction of said resistor and said inductor, a pair of amplifier input terminals connected respectively to said emitter electrode and to the junction of said capacitor and said resistor, and amplifier output terminals connected respectively to said collector electrode and to the junction of said inductor and said capacitor.

3. A transistor amplifier comprising a transistor having base, emitter and collector electrodes, a neutralizing network comprising a first capacitor, a second capacitor, and a resistor connected in the order recited in series in a closed loop, the components of said neutralizing network being proportioned to exhibit an open circuit backward transfer impedance which is of essentially equal magnitude and essentially opposite phase to the backward transfer impedance of said transistor, means for coupling said emitter electrode to the junction of said first capacitor and said second capacitor, a pair of amplifier input terminals connected respectively to said base electrode and to the junction of said resistor and said first capacitor, and a pair of amplifier output terminals connected respectively to said collector electrode and to the junction of said second capacitor and said resistor.

References Cited in the file of this patent

UNITED STATES PATENTS

| | | |
|---|---|---|
| 2,123,178 | Bode | July 12, 1938 |
| 2,170,645 | Peterson | Aug. 22, 1939 |
| 2,542,087 | Kreithen | Feb. 20, 1951 |
| 2,550,930 | Koch | May 1, 1951 |
| 2,790,033 | Keiper | Apr. 23, 1957 |
| 2,797,267 | Yost | June 25, 1957 |